(12) United States Patent
Srivastava et al.

(10) Patent No.: US 6,616,862 B2
(45) Date of Patent: Sep. 9, 2003

(54) YELLOW LIGHT-EMITTING HALOPHOSPHATE PHOSPHORS AND LIGHT SOURCES INCORPORATING THE SAME

(75) Inventors: Alok Mani Srivastava, Niskayuna, NY (US); Holly Ann Comanzo, Niskayuna, NY (US); Anant Achyut Setlur, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/681,686

(22) Filed: May 21, 2001

(65) Prior Publication Data

US 2003/0146411 A1 Aug. 7, 2003

(51) Int. Cl.[7] ........................... C09K 11/73; H01L 33/00
(52) U.S. Cl. ...................... 252/301.4 P; 252/301.4 F; 252/301.4 H; 313/503; 313/506; 257/98
(58) Field of Search ................ 252/301.4 P, 301.4 F, 252/301.4 H; 313/503, 506; 257/98

(56) References Cited

U.S. PATENT DOCUMENTS

| | | | |
|---|---|---|---|
| 2,488,733 A | 11/1949 | McKeag et al. | |
| 3,513,103 A | * 5/1970 | Shaffer | ................. 252/301.4 P |
| 4,038,204 A | 7/1977 | Wachtel | |
| 5,777,350 A | * 7/1998 | Nakamura et al. | |
| 5,838,101 A | 11/1998 | Pappalardo | |
| 5,998,925 A | * 12/1999 | Shimizu et al. | |
| 6,066,861 A | * 5/2000 | Hohn et al. | |
| 6,414,426 B1 | 7/2002 | Akashi et al. | |
| 2002/0158565 A1 | * 10/2002 | Setlur et al. | ................. 313/486 |

FOREIGN PATENT DOCUMENTS

| | | |
|---|---|---|
| DE | 10020465 | 8/2001 |
| JP | 49003631 | 1/1974 |
| WO | 0108452 | 2/2001 |
| WO | 0108453 | 2/2001 |

* cited by examiner

*Primary Examiner*—C. Melissa Koslow
(74) *Attorney, Agent, or Firm*—Toan P. Vo; Patrick K. Patnode

(57) ABSTRACT

Halophosphate luminescent materials co-activated with europium and manganese ions and having the general formula of $(Ca,Sr,Ba,Mg)_5(PO_4)_3:Eu^{2+},Mn^{2+}$ are disclosed. The inclusion of manganese shifts the peak emission to longer wavelengths and, thus, is beneficial in generating a bright yellow-to-orange light. White-light sources are produced by disposing a halophosphate luminescent material, optionally with a blue light-emitting phosphor, in the vicinity of a near UV/blue LED. Blue light-emitting phosphors that may be used in embodiments of the present inventions are $Sr_4Al_{14}O_{25}:Eu^{2+}$, $Sr_6P_6BO_{20}:Eu^{2+}$, $BaAl_8O_{13}:Eu^{2+}$, $(Sr,Mg,Ca,Ba)_5(PO_4)_3Cl:Eu^{2+}$, and $Sr_2Si_3O_6 \cdot 2SrCl_2:Eu^{2+}$.

34 Claims, 4 Drawing Sheets

YELLOW LIGHT-EMITTING HALOPHOSPHATE PHOSPHORS AND LIGHT SOURCES INCORPORATING THE SAME

CROSS REFERENCE TO RELATED APPLICATIONS

This patent application is related to application Ser. No. 09/681,549, titled "Phosphor Blends for Generating White Light From Near-UV/Blue Light-Emitting Devices," filed on Apr. 27, 2001.

FEDERAL RESEARCH STATEMENT

This invention was first conceived or reduced to practice in the performance of work under contract 70NANB8H4022 with the United States National Institute of Standards and Technology (NIST). The United States of America may have certain rights to this invention.

BACKGROUND OF THE INVENTION

This invention relates to yellow light-emitting halophosphate phosphors. In particular, this invention relates to hallow phosphate phosphors activated with $Eu^{2+}$ and $Mn^{2+}$ that emit yellow light upon being excited by near ultraviolet ("near UV")-to-blue electromagnetic radiation. This invention also relates to light sources incorporating such halophosphate phosphors to generate white light.

A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert the ultraviolet ("UV") radiation emitted by the excited mercury vapor to visible light. Other phosphors are capable of emitting visible light upon being excited by electrons (used in cathode ray tubes) or x rays (for example, scintillators in x-ray detection systems).

The efficiency of a lighting device that uses a phosphor increases as the difference between the wavelength of the exciting radiation and that of the emitted radiation narrows. Therefore, in the quest for improving efficiency of white light sources, effort has been dedicated to finding a source of stimulating radiation that has wavelengths longer than that of UV radiation and phosphors that respond to those wavelengths. Recent advances in light-emitting diode ("LED") technology have brought efficient LEDs emitting in the near UV-to-blue range. The term "LEDs" as used herein also includes laser diodes. The term "near UV" as used herein means UV radiation having wavelengths in the range from about 315 nm to about 410 nm. These LEDs emitting radiation in the near UV-to-blue range will be hereinafter called "UV/blue LEDs." As used herein, a UV/blue LED may emit radiation having wavelengths in the near UV range, in the blue light range, or in a broad range from near UV to blue. It would be an advance to the technology of lighting to provide a range of phosphors that can be stimulated by the radiation emitted from these UV/blue LEDs radiation sources to allow for a flexibility in the use of phosphors for generating various color LEDs. Such phosphors when combined with the emission from the UV/blue LEDs can provide efficient and long lasting lighting devices that consume little power.

Many near UV/blue LEDs based on combinations of nitrides of indium, aluminum, and gallium have recently appeared. For example, U.S. Pat. No. 5,777,350 discloses LEDs comprising multiple layers of InGa and p- and n-type AlGaN, which emit in the wavelength range from about 380 nm to about 420 nm. A LED of the InGaN type emitting blue light wavelengths was combined with a coating of a yellow light-emitting yttrium aluminum garnet phosphor activated with cerium ("YAG:Ce") to produce white light and is disclosed in U.S. Pat. No. 5,998,925. Similarly, U.S. Pat. No. 6,066,861 discloses an yttrium aluminum garnet phosphor activated with terbium and/or cerium in which yttrium may be substituted with Ca and/or Sr, aluminum with Ga and/or Si, and oxygen with S, to be used as a component of a wavelength conversion layer for a blue light-emitting LED. YAG:Ce and its variations emit a broad-spectrum yellow light. Although a substantial portion of the need for white light devices may be filled by LED-based devices, the ability to combine a UV/blue LED with a phosphor has been limited because yttrium aluminum garnet phosphor and minor variations thereof have been the only known yellow light-emitting phosphors that are excitable by radiation in the blue range. This limitation has restricted, to some extent, the ability flexibly to design light sources having different color temperatures and achieving a high color rendering index ("CRI").

Therefore, there is a need to provide phosphor compositions that are excitable in the near UV-to-blue range and emit in the visible range such that they may be used flexibly to design light sources having tunable properties, such as color temperature and CRI.

SUMMARY OF INVENTION

The present invention provides europium and manganese co-activated halophosphate phosphors that are excitable by electromagnetic radiation having wavelengths in the near UV-to-blue range (from about 315 nm to about 450 nm) to emit efficiently a visible light in a range from about 440 nm to about 770 nm. The emitted light has a broad spectrum with a peak in the range from about 550 nm to about 650 nm and has a yellow-to-orange color. A halophosphate phosphor of the present invention comprises two activators of $Eu^{2+}$ and $Mn^{2+}$ and has a general formula of $A_a(PO_4)_3D:Eu^{2+}$, $Mn^{2+}$ wherein A is selected from the group consisting of Ca, Sr, Ba, Mg, and combinations thereof; D is selected from the group consisting of F, Cl, OH, and combinations thereof; and a is in a range from about 4.5 to and including 5.

In one aspect of the present invention, a halophosphate phosphor is combined with at least one other phosphor that has a peak emission in the blue-green wavelength region (from about 450 nm to about 550 nm) to provide a white light. Such other phosphors may be selected from the group of $Sr_4Al_{14}O_{25}:Eu^{2+}$ (herein after called "SAE", peak emission at about 490 nm), $Sr_6P_6BO_{20}$ (peak emission at about 480 nm), $BaAl_8O_{13}$ (peak emission at about 480 nm), $A_5(PO_4)_3Cl:Eu^{2+}$ (peak emission at about 480 nm) where A is defined above, and $Sr_2Si_3O_6 \cdot 2SrCl_2$ (peak emission at about 490 nm).

In still another aspect of the present invention, a europium and manganese co-activated halophosphate of the present invention, either alone or in a mixture with one or more phosphors enumerated above, is disposed adjacent to a near UV/blue LED to provide a white-light source.

Other aspects, advantages, and salient features of the present invention will become apparent from a perusal of the following detailed description, which, when taken in conjunction with the accompanying figures, discloses embodiments of the present invention.

DETAILED DESCRIPTION

The present invention provides europium and manganese co-activated halophosphate phosphors that are excitable by electromagnetic radiation having wavelengths in the near UV-to-blue range (from about 315 nm to about 450 nm) to emit efficiently visible light in the wavelength range from about 440 nm to about 770 nm. The wavelength of the exciting radiation is preferably in the range from about 315 to about 420 nm, more preferably from about 350 nm to about 400 nm. A suitable near UV/blue LED for use with a phosphor blend of the present invention is one having an InGaN active layer as disclosed in U.S. Pat. No. 5,777,350. Particularly useful are those LEDs having a GaN layer or having only a very small amount of In dopant in the GaN layer as these LEDs would emit radiation predominantly in the wavelength range less than about 400 nm. In general, the halophosphate phosphors of the present invention have a formula of $A_a(PO_4)_3D:Eu^{2+},Mn^{2+}$ wherein A is selected from the group consisting of Ca, Sr, Ba, Mg, and combinations thereof; D is selected from the group consisting of F, Cl, OH, and combinations thereof; and a is in a range from about 4.5 to and including 5, preferably from about 4.7 to and including 5, and more preferably from about 4.9 to and including 5. In this formula, the elements following the colons represent the activators and are present at low atomic proportions compared to the metals, such as less than or equal to about 30 mole percent, preferably less than about 10 mole percent, and more preferably less than about 5 mole percent. Alternatively, the formula for the present halophosphate phosphors may be written according to conventions adopted in the art of phosphors as $(Ca,Sr,Ba,Mg)_a(PO_4)_3(F,Cl,OH):Eu^{2+},Mn^{2+}$. A group of elements separated by commas in a set of parentheses represent those elements that are interchangeable at the same lattice site. For example, calcium may be partially or completely substituted with Sr, Ba, Mg, or a combination thereof. By careful control of the composition, it is possible to generate phosphors emitting green, yellow, or orange light.

The preferred halophosphate phosphors of the present invention are $Ca_a(PO_4)_3Cl:Eu^{2+},Mn^{2+}$ and $Ca_a(PO_4)_3F:Eu^{2+},Mn^{2+}$ wherein a is defined above. Preferably, each of the activators $Eu^{2+}$ and $Mn^{2+}$ is present at a level of less than or equal to about 30 mole percent, preferably less than about 25 mole percent, more preferably less than about 10 mole percent, and most preferably less than about 5 mole percent of Ca.

Figure 1A:
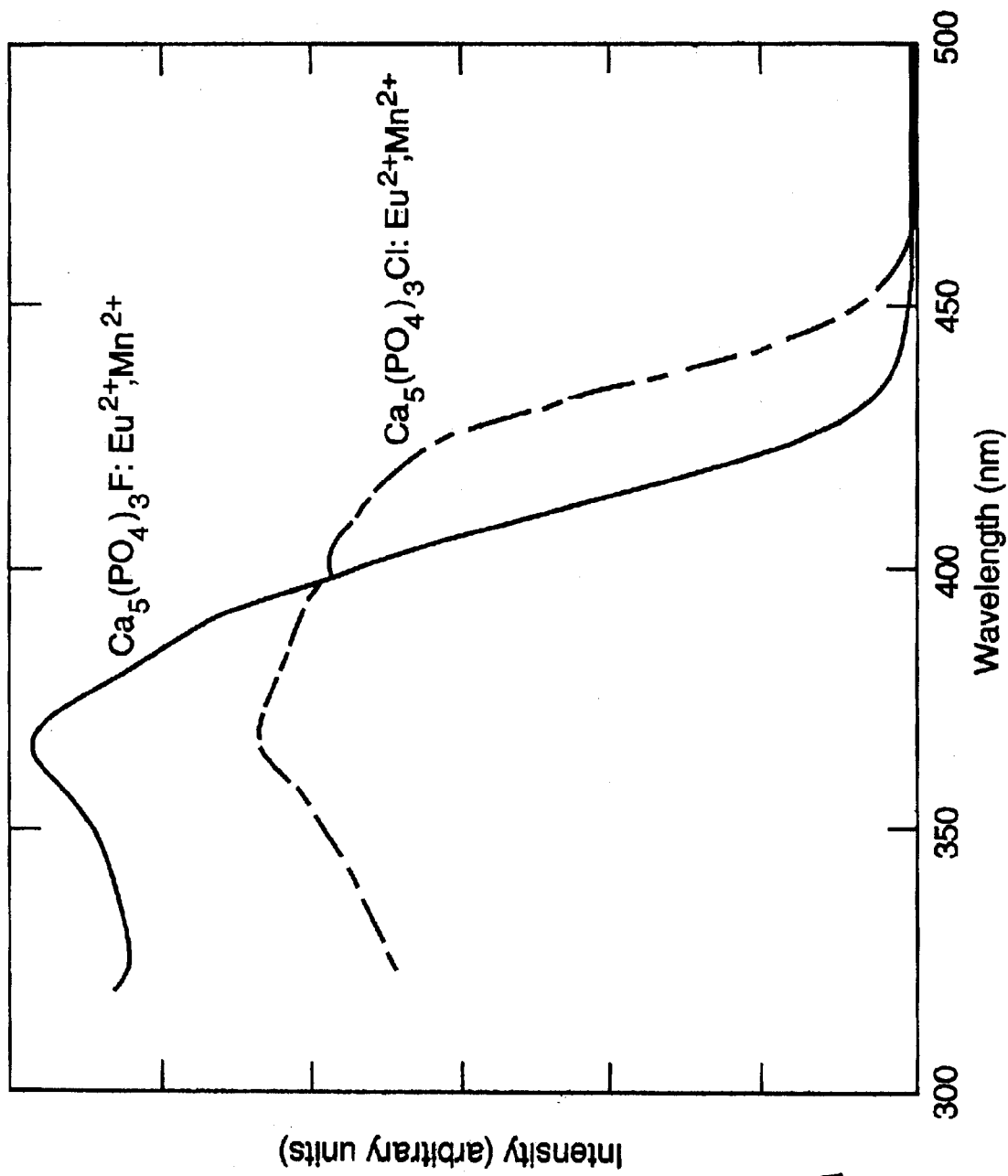
FIG. 1A shows the room-temperature excitation spectra of two halophosphate phosphors of the present invention.
Figure 1B:
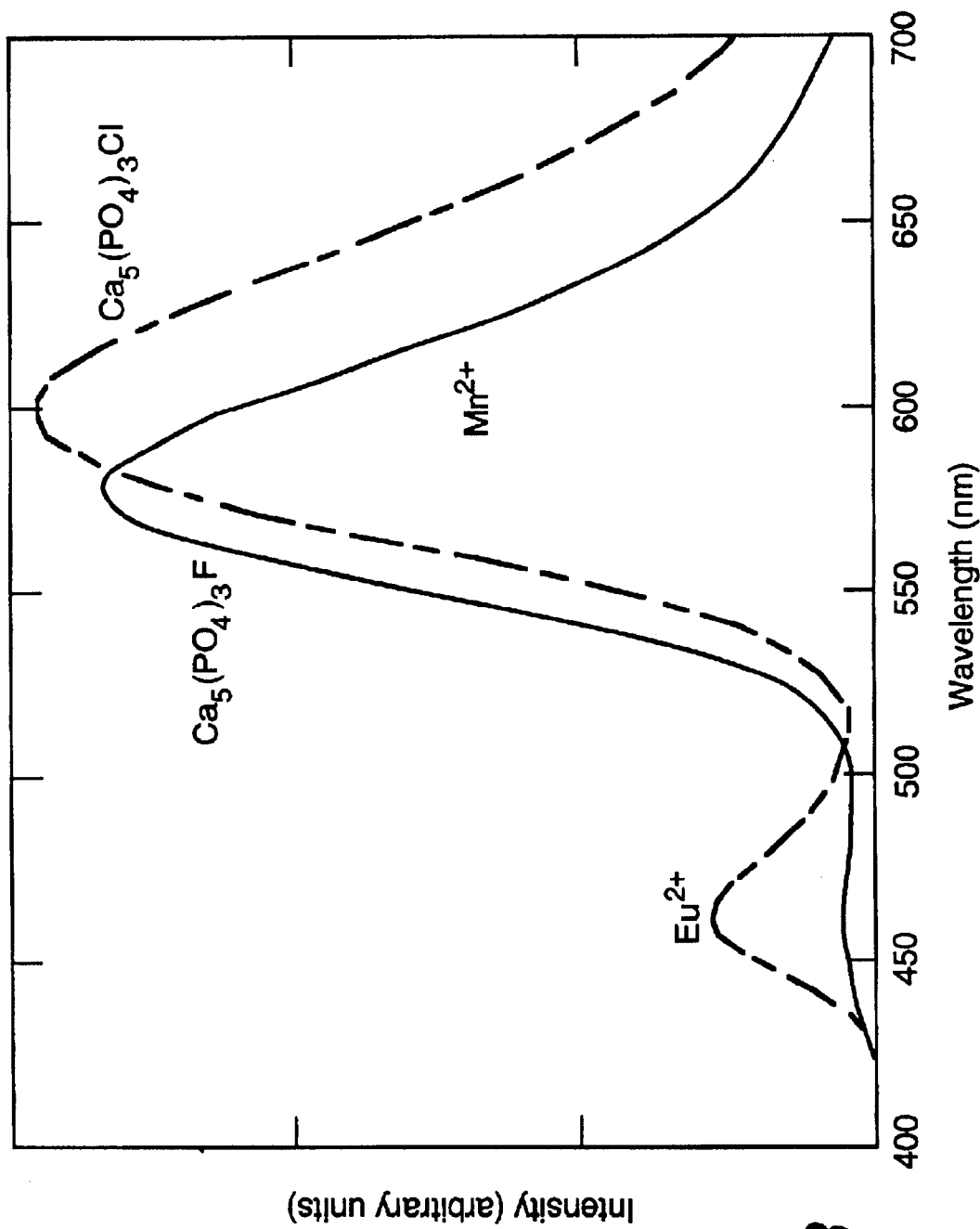
FIG. 1B shows the room-temperature emission spectra of the two halophosphate phosphors of FIG. 1A.
Figure 2:
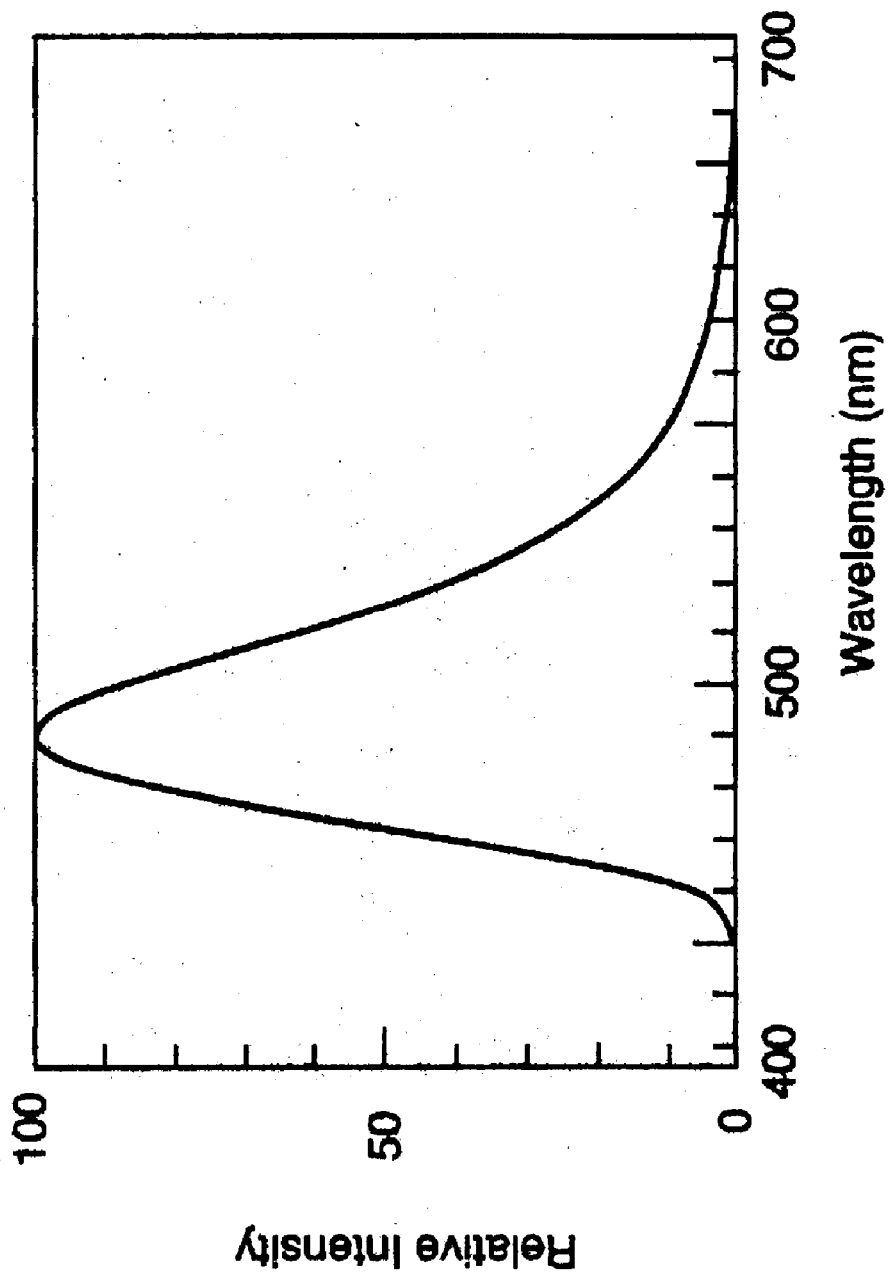
FIG. 2 shows the emission spectrum of the prior-art phosphor $AE_5(PO_4)_3Cl:Eu^{2+}$, wherein AE is a combination of Ba, Ca, and Mg.

FIGS. 1A and 1B show that the photoluminescence of the halophosphate phosphors is influenced by the halogen in the formula. Generally, a fluoride responds better to stimulating radiation of shorter wavelengths and also has a peak emission at a shorter wavelength than a chloride. Therefore, the color of the emitted light may be tuned by a partial substitution of fluoride with chloride. FIG. 2 shows an emission spectrum of a prior-art halophosphate phosphor activated with only europium $(AE_5(PO_4)_3Cl:Eu^{2+}$, wherein AE is a combination of Ba, Ca, and Mg). This prior-art phosphor has a peak wavelength at 480 nm, decidedly in the blue range. Although the Applicants do not wish to be bound by any particular theory, it is believed that the beneficial shift of the peak emission of the halophosphate phosphors of the present invention to a longer wavelength is a result of a transfer of a large part of the radiation energy absorbed by $Eu^{2+}$ to $Mn^{2+}$. Although the Applicants do not wish to be bound by any particular theory, it is believed that the additional peak emission of the halophosphate phosphors of the present invention at a long wavelength is a result of a transfer of a large part of the radiation energy absorbed by $Eu^{2+}$ to $Mn^{2+}$.

The halophosphate phosphors of the present invention may be made by any conventional solid state reaction. For example, phosphors having the general composition $(Ca_{1-p-q}Eu_pMn_q)_5(PO_4)_3D$, wherein $0<p\leq 0.3$, $0<q\leq 0.3$, and D is selected from the group consisting of F, Cl, and combinations thereof; by thoroughly blending appropriate amounts of the starting materials $CaHPO_4$, $Eu_2O_3$, $MnCO_3$, $NH_4Cl$, $CaCl_2$, $CaF_2$, and $(NH_4)HPO_4$, heating the mixture under a reducing atmosphere of 0.1 to 10% (by volume) of hydrogen in nitrogen at 1000–1300° C. for about 1–10 hours, and thereafter cooling to ambient temperature under the same reducing atmosphere. The heating time depends on the quantity of the materials to be processed. However, heating times of less than 10 hours are adequate. Calcium may be substituted with Sr, Ba, Mg, or a combination thereof to achieve other desired compositions.

In another aspect of the present invention, a yellow-to-orange light-emitting halophosphate phosphor as described above is blended with a blue light-emitting phosphor to provide a composite emitted white light. Examples of blue light-emitting phosphors that are excitable by near UV-to-blue electromagnetic radiation are $Sr_4Al_{14}O_{25}:Eu^{2+}$ ("SAE"), $Sr_6P_6BO_{20}:Eu^{2+}$, $BaAl_8O_{13}:Eu^{2+}$, $A_5(PO_4)_3Cl:Eu^{2+}$ (wherein A is selected from the group consisting of Sr, Mg, Ca, Ba, and combinations thereof), and $Sr_2Si_3O_6.2SrCl_2:Eu^{2+}$. The SAE phosphor is particularly useful in this application because its quantum efficiency is high (at 90%) and it does not absorb visible light. The desired color of the composite light will dictate the relative proportions of the europium and manganese co-activated halophosphate phosphors and the blue light-emitting phosphors.

WHITE LIGHT-EMITTING DEVICE

Incorporation of a blend of a halophosphate phosphor of the present invention and a blue light-emitting phosphor in a device comprising a LED emitting near UV-to-blue light in the wavelength range from about 315 nm to about 480 nm should provide a white light source that uses electrical energy efficiently. The white light source may be fabricated to provide a point source device by using one near UV/blue LED or a large-area lighting device by using a plurality of near UV/blue LEDs.

Figure 3:
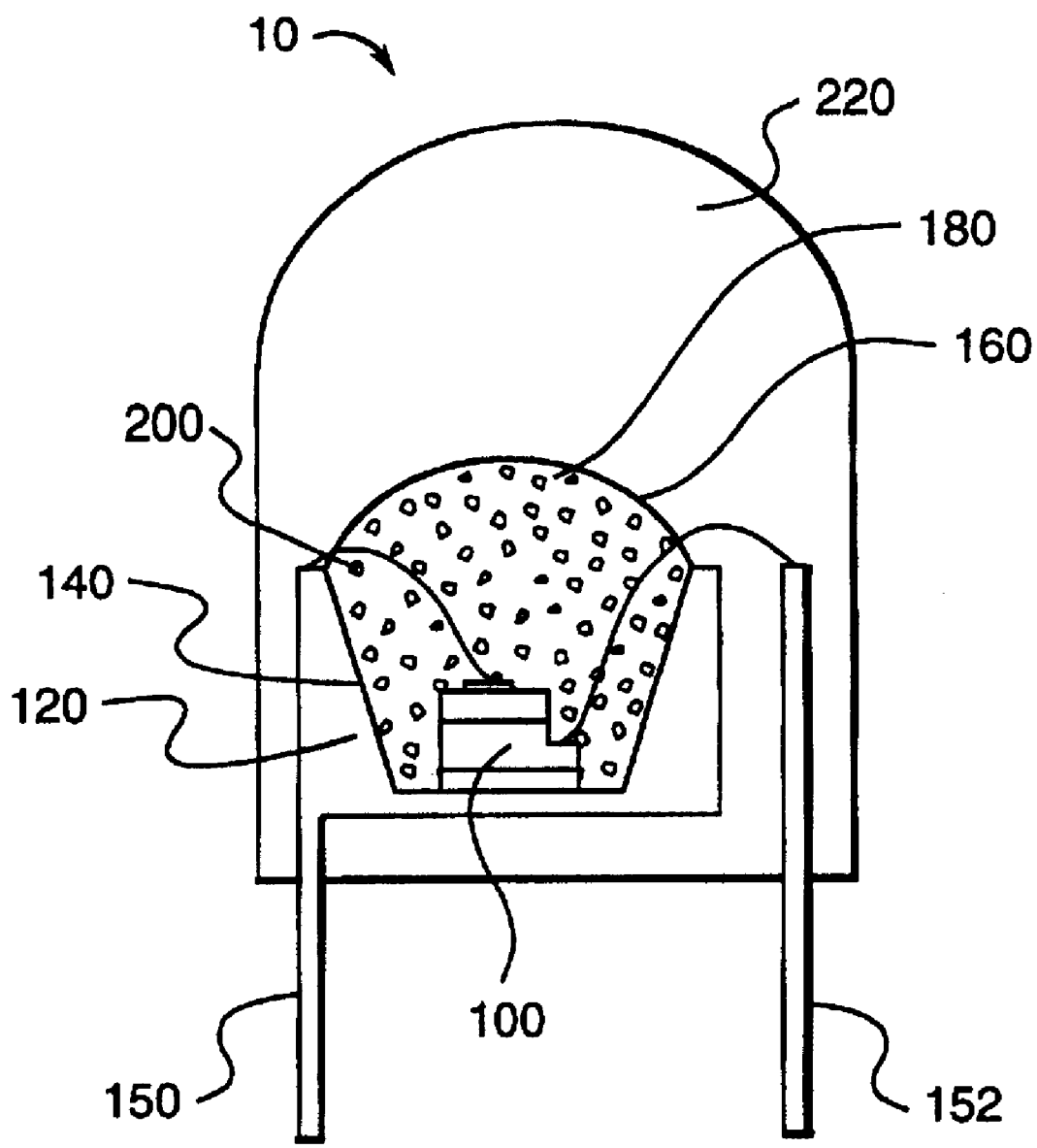
FIG. 3 shows a white-light source incorporating the halophosphate phosphors of the present invention.

In one embodiment of the present invention as shown in FIG. 3, a LED 100 emitting near UV/blue light in the range of about 315 nm to about 480 nm, preferably from about 350 nm to about 420 nm, more preferably from about 350 nm to about 400 nm is mounted in a cup 120 having a reflective surface 140 adjacent LED 100. Near UV/blue LEDs suitable for white light-emitting devices are GaN or In-doped GaN semiconductor-based LEDs such as those of U.S. Pat. No. 5,777,350 mentioned above, which is incorporated herein by reference. Other near UV/blue LEDs also may be used, such as LEDs based on GaN semiconductor doped with various metals to provide a large band gap. Electrical leads 150 and 152 are provided to supply electrical power to the LED. A transparent casting 160 comprising an epoxy or a silicone 180 in which there are dispersed substantially uniformly particles 200 of a phosphor of the present invention. Then a molded seal 220 of a transparent material, such as an epoxy or a silicone, is formed around the assembly of LED and phosphor casting to provide a hermetic seal thereto. Alternatively, the phosphor mixed with a binder may be applied as a coating over the LED surface, and a transparent casting is formed over the entire LED/phosphor combination to provide a hermetic seal. Other transparent polymers or materials also may be used. The composition of the InGaN active layer of the LED and the quantity of the phosphor applied in the casting may be chosen such that a portion of the blue light emitted by the LED that is not absorbed by the phosphor and the broad-spectrum light emitted by the phosphor are combined to provide a white light source 10 of a desired color temperature and CRI. Alternatively, when the light emitted by the active layer of the LED is deficient in the blue light range, the quantity of a blue light emitting-phosphor, such as one of the above-enumerated blue light-emitting phosphors, may be increased to provide adequate blend for the different color components.

A large-area white light source for general illumination may be produced by disposing a plurality of blue LEDs on a flat reflective panel, providing appropriate electrical leads to the individual LEDs, applying a coating comprising at least one phosphor blend of the present invention and a polymeric binder, such as an epoxy, and then sealing the whole combined structure in a transparent and hermetic seal. The phosphor blend/polymer coating may be applied directly on the individual LEDs or it may be applied over the entire panel surface. In the former case, an additional polymer coating may be applied over the entire panel surface after the phosphor has been applied on the LEDs. In addition, particles of an inert solid, such as $TiO_2$ or $Al_2O_3$, may be provided in the polymer matrix to enhance the uniformity of the light emission from the device.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A luminescent material being activated by both europium and manganese and having a composition represent by $(Ca_{1-x-y-p-q}Sr_xBa_yMg_zEu_pMn_q)_a(PO_4)_3D$, wherein $0 \leq x \leq 1$, $0 \leq y \leq 1$, $0 \leq z \leq 1$, $0<p \leq 0.3$, $0<q \leq 0.3$, $0<x+y+z+p+q \leq 1$, $4.5 \leq a \leq 5$, and D is selected from the group consisting of F, OH, and combinations thereof; said luminescent material being capable of absorbing electromagnetic radiation that has wavelengths in a range from about 315 nm to about 450 nm and being capable of emitting visible light.

2. The luminescent material of claim 1, wherein both p and q are positive and each is less than about 0.1.

3. The luminescent material of claim 1, wherein a is in a range from about 4.7 to and including 5.

4. The luminescent material of claim 1, wherein both p and q are positive and each is less than about 0.05.

5. The luminescent material of claim 1, wherein a is in a range from about 4.9 to and including 5.

6. A luminescent material being activated by both europium and manganese and having a composition represent by $(Ca_{1-p-q}Eu_pMn_q)_a(PO_4)_3F$, wherein $0<p \leq 0.3$, $0<q \leq 0.3$, and $4.5 \leq a \leq 5$; said luminescent material being capable of absorbing electromagnetic radiation that has wavelengths in a range from about 315 nm to about 450 nm and being capable of emitting visible light.

7. The luminescent material of claim 6, wherein both p and q are positive and each is less than about 0.1.

8. The luminescent material of claim 6, wherein a is in a range from about 4.9 to and including 5.

9. The luminescent material of claim 6, wherein both p and q are positive and each is less than about 0.05.

10. The luminescent material of claim 6, wherein a is in a range from about 4.9 to and including 5.

11. A luminescent material being activated by both europium and manganese and having a composition represent by $(Ca_{1-p-q}Eu_pMn_q)_a(PO_4)_3Cl$, wherein $0<p \leq 0.3$, $0<q \leq 0.3$, and $4.5 \leq a<5$; said luminescent material being capable of absorbing electromagnetic radiation that has wavelengths in a range from about 315 nm to about 450 nm and being capable of emitting visible light.

12. The luminescent material of claim 11, wherein both p and q are positive and each is less than about 0.1.

13. The luminescent material of claim 11, wherein a is in a range from about 4.7 to less than about 5.

14. The luminescent material of claim 11, wherein both p and q are positive and each is less than about 0.05.

15. The luminescent material of claim 11, wherein a is in a range from about 4.9 to less than about 5.

16. A light source comprising:
    at least one LED that is capable of emitting electromagnetic radiation having wavelengths in a range from near UV to blue; and
    at least one luminescent material selected from the group of luminescent materials having a general formula of $(Ca_{1-x-y-p-q}Sr_xBa_yMg_zEu_pMn_q)_a(PO_4)_3D$,
    wherein $0 \leq x \leq 1$, $0 \leq y \leq 1$, $0 \leq z \leq 1$, $0<p \leq 0.3$, $0<q \leq 0.3$, $0<x+y+z+p+q \leq 1$, $4.5 \leq a \leq 5$, and D is selected from the group consisting of F, Cl, OH, and combinations thereof; said luminescent material being capable of absorbing said electromagnetic radiation emitted by said LED and emitting light having wavelengths in the visible spectrum.

17. The light source of claim 16, wherein said LED emits electromagnetic radiation having wavelengths in a range from about 315 nm to about 450 nm.

18. The light source of claim 17, wherein said LED preferably emits electromagnetic radiation having wavelengths in a range from about 350 nm to about 420 nm.

19. The light source of claim 17, wherein said LED preferably emits electromagnetic radiation having wavelengths in a range from about 350 nm to about 400 nm.

20. The light source of claim 16 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $A_5(PO_4)_3Cl:Eu^{2+}$, and $Sr_2Si_3O_6 \cdot 2SrCl_2:Eu^{2+}$; wherein A is selected from the group consisting of Sr, Mg, Ca, Ba, and combinations thereof.

21. A light source comprising:
    at least one LED that is capable of emitting electromagnetic radiation having wavelengths in a range from near UV to blue; and a luminescent material having a formula of $(Ca_{1-p-q}Eu_pMn_q)_a(PO_4)_3F$, wherein $0<p\leq0.3$, $0<q\leq0.3$, and $4.5\leq a\leq5$; said luminescent material being capable of absorbing said electromagnetic radiation emitted by said LED and emitting light having wavelengths in the visible spectrum.

22. The light source of claim 21 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $(Sr,Mg,Ca,Ba)_5(PO_4)_3Cl:Eu^{2+}$, and $Sr_2Si_3O_6\cdot2SrCl_2:Eu^{2+}$.

23. A light source comprising:

at least one LED that is capable of emitting electromagnetic radiation having wavelengths in a range from near UV to blue; and a luminescent material having a formula of $(Ca_{1-p-q}Eu_pMn_q)_a(PO_4)_3Cl$, wherein $0<p\leq0.3$, $0<q\leq0.3$, and $4.5\leq a\leq5$; said luminescent material being capable of absorbing said electromagnetic radiation emitted by said LED and emitting light having wavelengths in the visible spectrum.

24. The light source of claim 23 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $A_5(PO_4)_3Cl:Eu^{2+}$, and $Sr_2Si_3O_6\cdot2SrCl_2:Eu^{2+}$; wherein A is selected from the group consisting of Sr, Mg, Ca, Ba, and combinations thereof.

25. A light source comprising:

a plurality of LEDs, each being capable of emitting electromagnetic radiation having wavelengths in a range from near UV to blue; and at least one luminescent material selected from the group of luminescent materials having a general formula of $(Ca_{1-x-y-p-q}Sr_xBa_yMg_zEu_pMn_q)_a(PO_4)_3D$, wherein $0\leq x\leq1$, $0\leq y\leq1$, $0\leq z\leq1$, $0<p\leq0.3$, $0<q\leq0.3$, $0<x+y+z+p+q\leq1$, $4.5\leq a\leq5$, and D is selected from the group consisting of F, Cl, OH, and combinations thereof; said luminescent material being capable of absorbing said electromagnetic radiation emitted by said LED and emitting light having wavelengths in the visible spectrum.

26. The light source of claim 25, wherein said plurality of LEDs emit electromagnetic radiation having wavelengths in a range from about 315 nm to about 450 nm.

27. The light source of claim 26 wherein said plurality of LEDs preferably emit electromagnetic radiation having wavelengths in a range from about 350 nm to about 420 nm.

28. The light source of claim 26 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $A_5(PO_4)_3Cl:Eu^{2+}$, and $Sr_2Si_3O_6\cdot2SrCl_2:Eu^{2+}$; wherein A is selected from the group consisting of Sr, Mg, Ca, Ba, and combinations thereof.

29. The light source of claim 26 wherein said plurality of LEDs preferably emit electromagnetic radiation having wavelengths in a range from about 350 nm to about 400 nm.

30. A light source comprising:

a plurality of LEDs, each being capable of emitting electromagnetic radiation having wavelengths in a range from near UV to blue; and a luminescent material having a formula of $(Ca_{1-p-q}Eu_pMn_q)_a(PO_4)_3F$, wherein $0<p\leq0.3$, $0<q\leq0.3$, and $4.5\leq a\leq5$; said luminescent material being capable of absorbing said electromagnetic radiation emitted by said LED and emitting light having wavelengths in the visible spectrum.

31. The light source of claim 30 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $A_5(PO_4)_3Cl:Eu^{2+}$, and $Sr_2Si_3O_6\cdot2SrCl_2:Eu^{2+}$; wherein A is selected from the group consisting of Sr, Mg, Ca, Ba, and combinations thereof.

32. A light source comprising:

a plurality of LEDs, each being capable of emitting electromagnetic radiation having wavelengths in a range from near UV to blue; and a luminescent material having a formula of $(Ca_{1-p-q}Eu_pMn_q)_5(PO_4)_3Cl$, wherein $0<p\leq0.3$, $0<q\leq0.3$, and $4.5\leq a\leq5$; said luminescent material being capable of absorbing said electromagnetic radiation emitted by said LED and emitting light having wavelengths in the visible spectrum.

33. The light source of claim 32 further comprising at least one luminescent material selected from the group consisting of $Sr_4Al_{14}O_{25}:Eu^{2+}$, $Sr_6P_6BO_{20}:Eu^{2+}$, $BaAl_8O_{13}:Eu^{2+}$, $A_5(PO_4)_3Cl:Eu^{2+}$, and $Sr_2Si_3O_6\cdot2SrCl_2:Eu^{2+}$; wherein A is selected from the group consisting of Sr, Mg, Ca, Ba, and combinations thereof.

34. A luminescent material being activated by both europium and manganese and having a composition represent by $(Ca_{1-x-y-p-q}Sr_xBa_yMg_zEu_pMn_q)_a(PO_4)_3D$, wherein $0\leq x\leq1$, $0\leq y\leq1$, $0<z\leq1$, $0<p\leq0.3$, $0<q\leq0.3$, $0<x+y+z+p+q\leq1$, $4.5\leq a\leq5$, and D is selected from the group consisting of F, Cl, OH, and combinations thereof; said luminescent material being capable of absorbing electromagnetic radiation that has wavelengths in a range from about 315 nm to about 450 nm and being capable of emitting visible light.

* * * * *